(12) United States Patent
Okabe et al.

(10) Patent No.: US 10,672,854 B2
(45) Date of Patent: Jun. 2, 2020

(54) DISPLAY DEVICE

(71) Applicant: Sharp Kabushiki Kaisha, Sakai, Osaka (JP)

(72) Inventors: Tohru Okabe, Sakai (JP); Hiroki Taniyama, Sakai (JP); Ryosuke Gunji, Sakai (JP); Shinsuke Saida, Sakai (JP); Hiroharu Jinmura, Sakai (JP); Yoshihiro Nakada, Sakai (JP); Akira Inoue, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 28 days.

(21) Appl. No.: 16/066,686

(22) PCT Filed: Mar. 29, 2017

(86) PCT No.: PCT/JP2017/012886
§ 371 (c)(1),
(2) Date: Jun. 28, 2018

(87) PCT Pub. No.: WO2018/179132
PCT Pub. Date: Oct. 4, 2018

(65) Prior Publication Data
US 2019/0363149 A1    Nov. 28, 2019

(51) Int. Cl.
*H01L 27/32* (2006.01)
*H01L 51/52* (2006.01)

(52) U.S. Cl.
CPC ...... *H01L 27/3276* (2013.01); *H01L 27/3246* (2013.01); *H01L 51/5218* (2013.01); *H01L 51/5234* (2013.01); *H01L 51/5253* (2013.01)

(58) Field of Classification Search
None
See application file for complete search history.

(56) References Cited

U.S. PATENT DOCUMENTS

| 9,122,116 | B2 | 9/2015 | Fujikawa |
| 2014/0209914 | A1 | 7/2014 | Nagasawa et al. |
| 2015/0060783 | A1 | 3/2015 | Yoon |
| 2015/0144977 | A1 | 5/2015 | Odaka et al. |
| 2016/0043351 | A1* | 2/2016 | Hsu ........... H01L 51/002 438/99 |

(Continued)

FOREIGN PATENT DOCUMENTS

| JP | 2009-69251 A | 4/2009 |
| JP | 2014-145857 A | 8/2014 |

(Continued)

OTHER PUBLICATIONS

Official Communication issued in International Patent Application No. PCT/JP2017/012886, dated Jul. 4, 2017.

*Primary Examiner* — Jay C Chang
(74) *Attorney, Agent, or Firm* — Keating & Bennett, LLP

(57) ABSTRACT

A display device production method for producing a display device including a light emitting element in an active region and a terminal in a non-active region. The display device production method includes arranging a first mask overlapping with an electrode region of the light emitting element and a second mask overlapping with the terminal, on a conductive film that is arranged in the active region and the non-active region and that covers the terminal, and etching the conductive film.

18 Claims, 12 Drawing Sheets

(56) References Cited

U.S. PATENT DOCUMENTS

2016/0086977 A1\* 3/2016 Go .................... H01L 27/124
  257/773
2016/0087023 A1\* 3/2016 Maeda ............... H01L 27/3276
  257/40

FOREIGN PATENT DOCUMENTS

| JP | 2015-103490 A | 6/2015 |
| JP | 2016-62874 A | 4/2016 |
| WO | 2013/011678 A1 | 1/2013 |

\* cited by examiner

COMPARATIVE EMBODIMENT

DISPLAY DEVICE

TECHNICAL FIELD

The disclosure relates to a display device.

BACKGROUND ART

In PTL 1, a structure of a terminal portion of a display panel including an organic EL element is disclosed.

CITATION LIST

Patent Literature

PTL 1: 2009-69251A (published Apr. 2, 2009)

SUMMARY

Technical Problem

A technology disclosed in PTL 1 includes lots of processes for forming the terminal portion, and has an issue of low production efficiency.

Solution to Problem

A display device production method according to an aspect of the disclosure is a production method of a display device that includes a light emitting element in an active region and a terminal in a non-active region. The display device production method includes: arranging a first mask overlapping with an electrode region of the light emitting element and a second mask overlapping with the terminal, on a conductive film that is arranged in the active region and the non-active region and that covers the terminal, and etching the conductive film, in a first etching process.

Advantageous Effects of Disclosure

According to an aspect of the disclosure, the number of processes for forming a terminal portion is reduced, and production efficiency of a device is improved.

DESCRIPTION OF EMBODIMENTS

Figure 1:
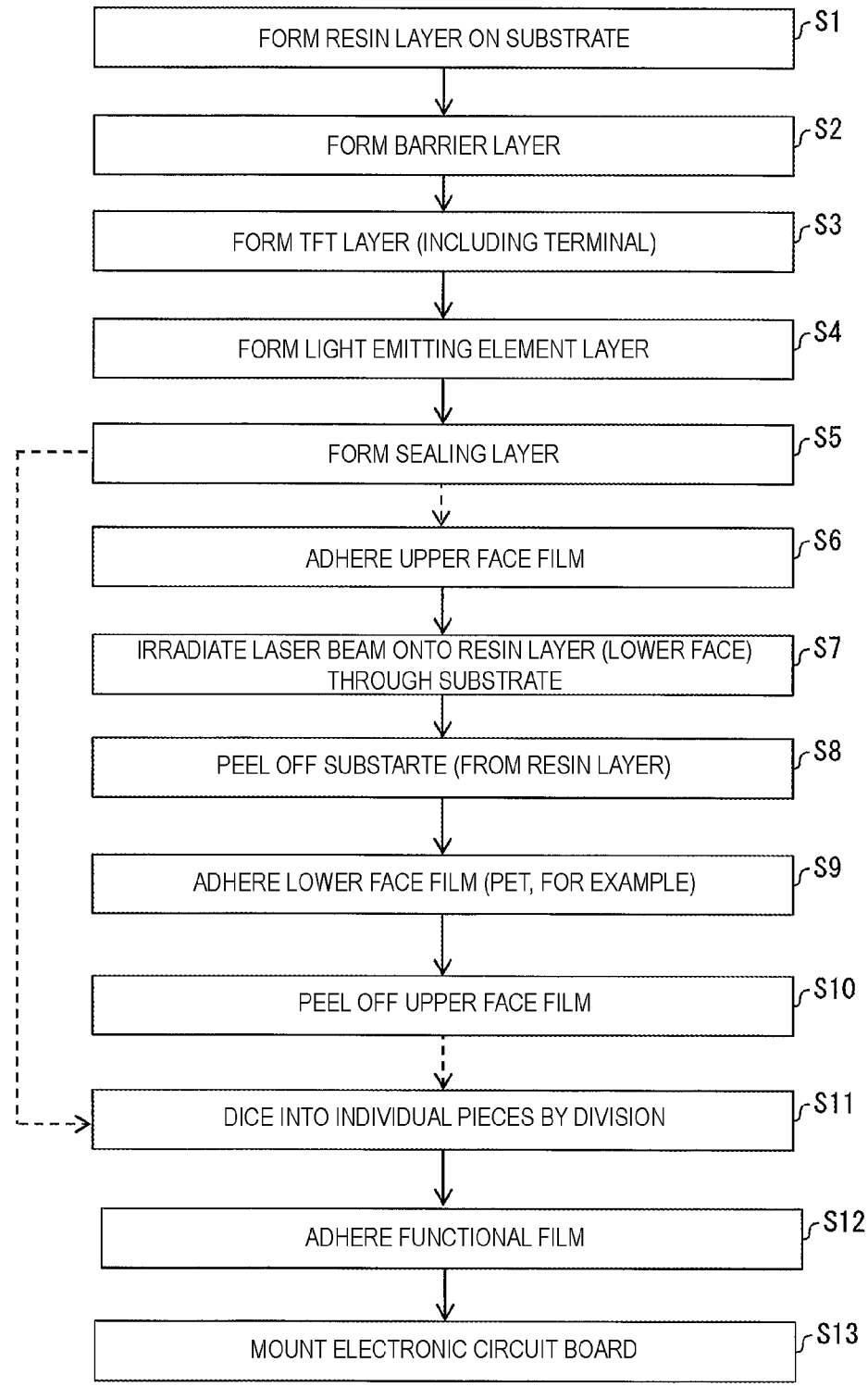
FIG. 1 is a flowchart illustrating an example of a production method of a display device.
Figure 2A:
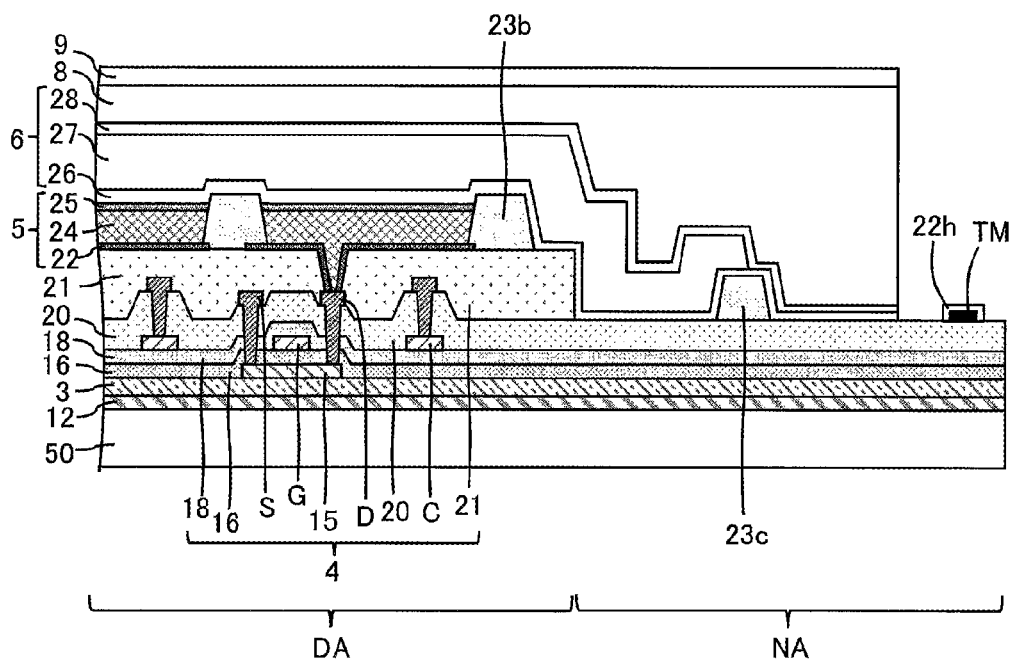
FIG. 2A is a cross-sectional view illustrating a configuration example of the display device of a first embodiment that is in a process of being formed.
Figure 2B:
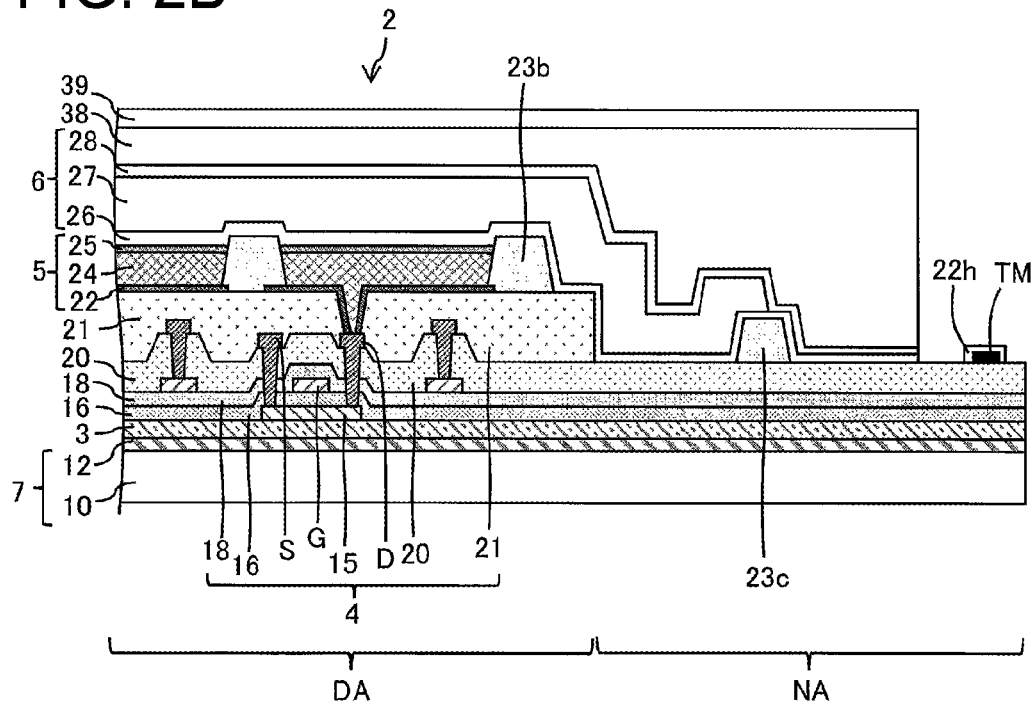
FIG. 2B is a cross-sectional view illustrating the configuration example of the display device of the first embodiment.
Figure 3:
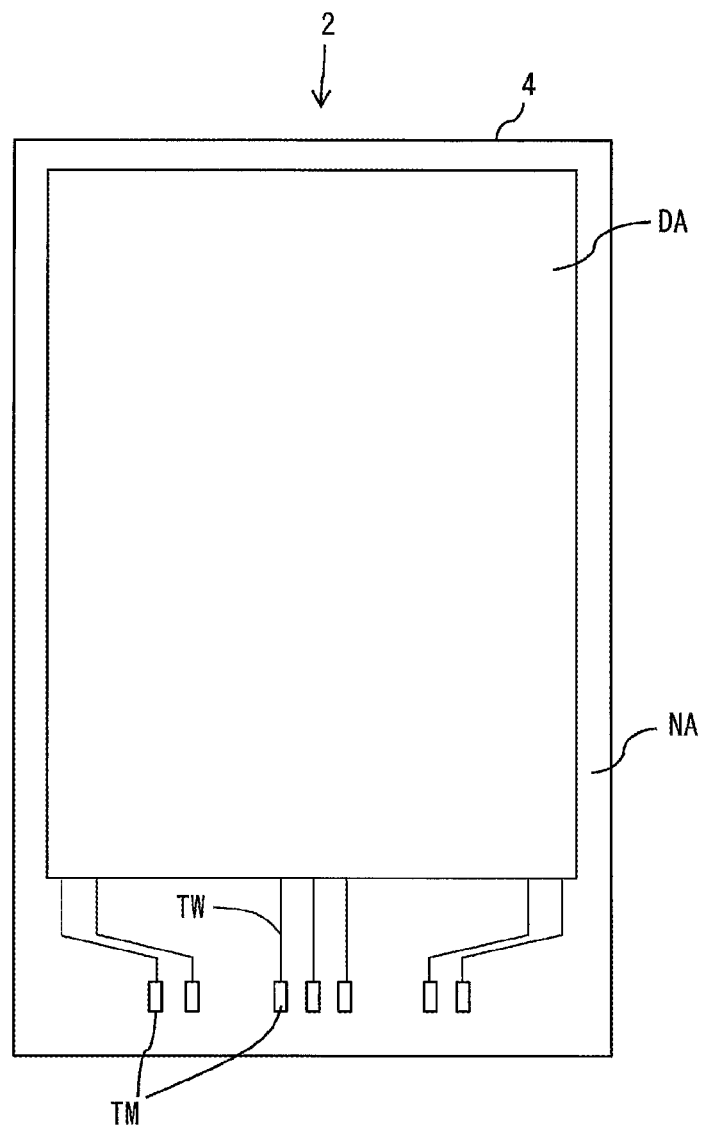
FIG. 3 is a plan view illustrating the configuration example of the display device of the first embodiment.

FIG. 1 is a flowchart illustrating an example of a production method of a display device. FIG. 2A is a cross-sectional view illustrating a configuration example of the display device of a first embodiment that is in a process of being formed, and FIG. 2B is a cross-sectional view illustrating the configuration example of the display device of the first embodiment. FIG. 3 is a plan view illustrating the configuration example of the display device of the first embodiment.

In producing a flexible display device, as illustrated in FIG. 1 to FIG. 3, first, a resin layer 12 is formed on a light transmissive substrate 50 (a substrate, for example) (step S1). Next, a barrier layer 3 is formed (step S2). Next, a TFT layer 4 is formed that includes inorganic insulating layers 16, 18, and 20 and an interlayer insulating film 21 (step S3). Next, a light emitting element layer (for example, an OLED element layer) 5 is formed (step S4). Next, a sealing layer 6 is formed that includes a first inorganic sealing film 26, a second inorganic sealing film 28, and an organic sealing film 27 (step S5). Next, an upper face film 9 is adhered to the sealing layer 6, with an adhesive layer 8 interposed therebetween (step S6).

Next, a laser beam is irradiated onto a lower face of the resin layer 12 through the substrate 50 (step S7). Here, as a result of the resin layer 12 absorbing the laser beam that has been irradiated onto a lower face of the substrate 50 and transmitted through the substrate 50, the lower face of the resin layer 12 (an interface with the substrate 50) changes in quality due to ablation, and thus a bonding strength between the resin layer 12 and the substrate 50 decreases. Next, the substrate 50 is peeled off from the resin layer 12 (step S8). Next, a lower face film 10 (PET, for example) is adhered to the lower face of the resin layer 12, with an adhesive layer 11 interposed therebetween (step S9). Next, the upper face film 9 is peeled off (step S10). Next, the substrate 50 is divided and diced into individual pieces (step S11). As a result, a display device 2 illustrated in FIG. 2B and FIG. 3 is obtained. Next, a functional film 39 is adhered, with an adhesive layer 38 interposed (step S12). Next, an electronic circuit board is mounted on an end portion of the TFT layer 4 (step S13). Note that each of the above-described steps is performed by a display device production device.

Examples of a material of the resin layer 12 include a polyimide, an epoxy, and a polyamide. Examples of a material of the lower face film 10 include polyethylene terephthalate (PET).

The barrier layer 3 is a layer that inhibits moisture or impurities from reaching the TFT layer 4 or a light emitting element 5 when the display device is being used, and can be configured by a silicon oxide film, a silicon nitride film, or a silicon oxinitride film, or a layered film thereof, each of which is formed using CVD. The thickness of the barrier layer 3 is from 50 nm to 1500 nm, for example.

The TFT layer 4 includes a semiconductor film 15, the inorganic insulating film 16 (a gate insulating film) that is formed on the upper side of the semiconductor film 15, a gate electrode G that is formed on the upper side of the gate insulating film 16, the inorganic insulating film 18 that is formed on the upper side of the gate electrode G, a capacity wiring line C that is formed on the upper side of the inorganic insulating film 18, the inorganic insulating film 20 that is formed on the upper side of the capacity wiring line C, a source wiring line S, a drain wiring line D, and terminals TM that are formed on the upper side of the inorganic insulating film 20, and the interlayer insulating film 21 that is formed on the upper side of the source wiring line S and the drain wiring line D.

A thin film transistor (TFT) is configured to include the semiconductor film 15, the inorganic insulating film 16 (the gate insulating film), and the gate electrode G. In the end portion of the TFT layer 4 (a non-active region NA), a plurality of the terminals TM and terminal wiring lines are formed to be used for a connection with the electronic circuit board, such as an IC chip, a flexible printed circuit (FPC), and the like. The terminals TM are connected to various wiring lines of the TFT layer 4 via the terminal wiring line.

The semiconductor film 15 is configured by a low-temperature polysilicon (LTPS) or an oxide semiconductor, for example. The gate insulating film 16 can be formed by a silicon oxide (SiOx) film or a silicon nitride (SiNx) film, or a layered film of these, formed using CVD. The gate electrode G, the source wiring line S, the drain wiring line D, and the terminals TM are each configured by a single-layer metal film or a layered metal film including at least one of, for example, aluminum (Al), tungsten (W), molybdenum (Mo), tantalum (Ta), chrome (Cr), titanium (Ti), and copper (Cu). Note that, in FIGS. 2A and 2B, although the TFT, in which the semiconductor film 15 serves as a channel, has a top gate structure, the TFT may have a bottom gate structure (e.g., when the channel of the TFT is an oxide semiconductor).

The inorganic insulating films 18 and 20 can be configured by a silicon oxide (SiOx) film or a silicon nitride (SiNx) film, or a layered film thereof, each of which is formed using CVD. The interlayer insulating film 21 can be configured by a photosensitive organic material to which a polyimide, an acrylic, and the like can be applied.

The light emitting element layer 5 (e.g., an organic light emitting diode layer) is configured by an anode electrode 22 that is formed on the upper side of the interlayer insulating film 21, a bank 23b that defines a subpixel of an active region DA (a region overlapping with the light emitting element layer 5), an electroluminescence (EL) layer 24 that is formed on the upper side of the anode electrode 22, and a cathode electrode 25 that is formed on the upper side of the EL layer 24. A light emitting element (e.g., an organic light emitting diode) is configured by the anode electrode 22, the EL layer 24, and the cathode electrode 25.

A protrusion 23c that defines edges of the organic sealing film 27 is formed in the non-active region NA. The protrusion 23c is formed on, for example, the inorganic insulating film 20, and functions as a liquid stopper when the organic sealing film 27 is applied using an ink-jet method. The bank 23b and the protrusion 23c can be formed in the same process, for example, using a photosensitive organic material to which a polyimide, an epoxy, an acrylic, and the like can be applied.

The EL layer 24 is formed in a region (a subpixel region) surrounded by the bank 23b using a vapor deposition method or an ink-jet method. When the light emitting element layer 5 is an organic light emitting diode (OLED) layer, the EL layer 24 is configured, for example, by layering a hole injecting layer, a hole transport layer, a light emitting layer, an electron transport layer, and an electron injecting layer in the above order from the lower layer side.

The anode electrode (a positive electrode) 22 is configured by layering Indium Tin Oxide (ITO) and an alloy containing Ag, for example, and has light reflectivity (to be described below in more detail). The cathode electrode 25 can be configured by a conductive material with a light transmissive characteristic such as Indium Tin Oxide (ITO) and Indium Zincum Oxide (IZO).

When the light emitting element layer 5 is the OLED layer, positive holes and electrons are recombined inside the EL layer 24 by a drive current between the anode electrode 22 and the cathode electrode 25. Excitons that are generated by the recombination falls into a ground state, and light is emitted. Since the cathode electrode 25 is light transmissive and the anode electrode 22 is light reflective, the light emitted from the EL layer 24 travels upwards and results in top emission.

The light emitting element layer 5 may not necessarily configure the OLED element, but may configure an inorganic light emitting diode or a quantum dot light emitting diode.

The sealing layer 6 has a light transmissive characteristic, and includes the first inorganic sealing film 26 that covers the cathode electrode 25, the organic sealing film 27 that is formed on the upper side of the first inorganic sealing film 26, and the second inorganic sealing film 28 that covers the organic sealing film 27.

The first inorganic sealing film 26 and the second inorganic sealing film 28 can be each configured by a silicon oxide film, a silicon nitride film, or a silicon oxinitride film, or by a layered film thereof, each of which is formed using CVD. The organic sealing film 27 is thicker than the first inorganic sealing film 26 and the second inorganic sealing film 28, is a light transmissive organic insulating film, and can be configured by a photosensitive organic material to which a polyimide, an acrylic, and the like can be applied. For example, after applying an ink containing such an organic material onto the first inorganic sealing film 26 using the ink-jet method, the ink is hardened by UV irradiation. The sealing layer 6 covers the light emitting element layer 5 and inhibits foreign matter, such water and oxygen, from infiltrating into the light emitting element layer 5.

Note that the upper face film 9 is adhered to the sealing layer 6, with the adhesive layer 8 interposed therebetween, and functions as a support material when the substrate 50 is peeled off. Examples of a material of the upper face film 9 include polyethylene terephthalate (PET).

After the substrate 50 has been peeled off, the lower face film 10 is adhered to the lower face of the resin layer 12 to produce a display device having excellent flexibility. Examples of a material of the lower face film 10 include PET.

The functional film 39 has, for example, an optical compensation function, a touch sensor function, a protective function, and the like. An electronic circuit board 60 is an IC chip or a flexible printed circuit board that is mounted on the plurality of terminals TM, for example.

Although a case in which a flexible display device is produced has been described above, in producing a non-flexible display device, replacement of the substrate, adhesion of the upper face film, and the like can be eliminated, and thus the processing moves from step S5 to step S11 in FIG. 1.

First Embodiment

Figure 4:
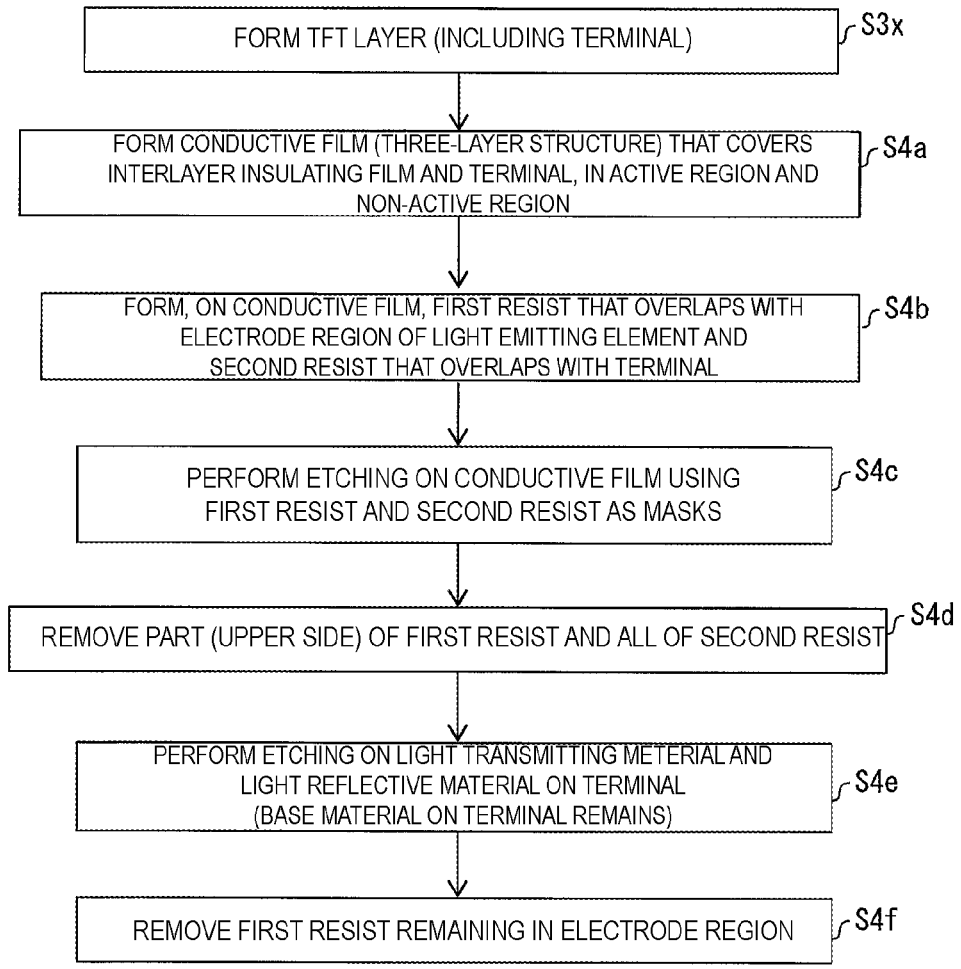
FIG. 4 is a flowchart illustrating a formation process of electrodes and a terminal film in the first embodiment.

FIG. 4 is a flowchart illustrating a formation process of the electrodes and a terminal film in the first embodiment. FIGS. 5A to 6C are cross-sectional views illustrating the formation process of the electrode and the terminal film in the first embodiment. FIG. 7 is a plan view illustrating an arrangement example of masks in the first embodiment.

Figure 5A:
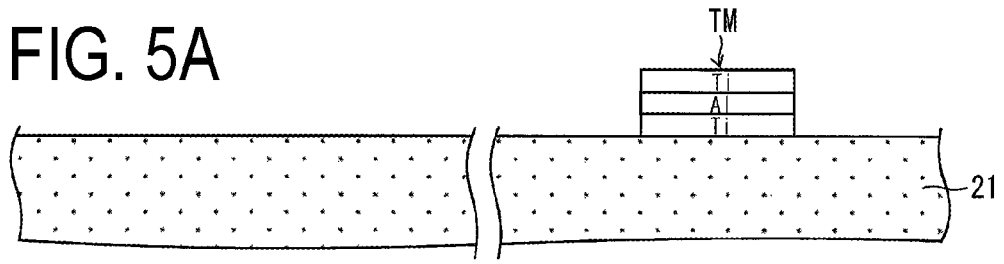
FIGS. 5A to 5D are cross-sectional views illustrating the formation process of the electrodes and the terminal film in the first embodiment.
Figure 5B:
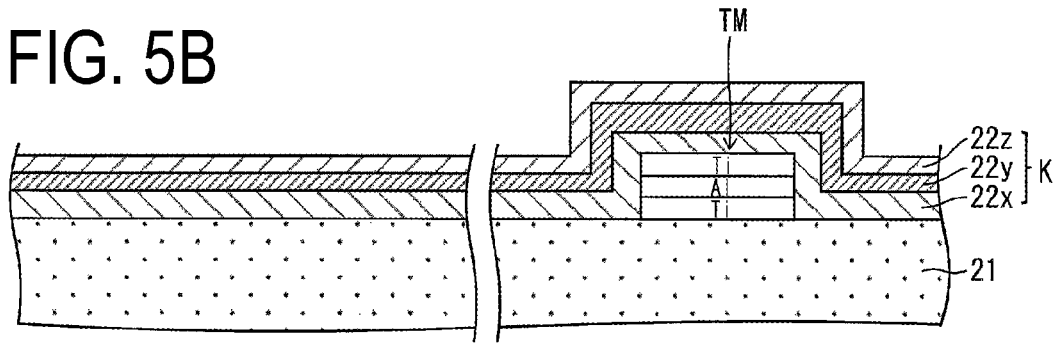

In the first embodiment, first, as illustrated in FIG. 4, FIG. 5A, and FIG. 7, the plurality of terminals TM are formed on an end portion of the interlayer insulating film 21, which is located in the non-active region NA (step S3x). Each of the terminals TM is configured by sandwiching an aluminum film (an Al film) using two titanium films (Ti films). Next, as illustrated in FIG. 4, FIG. 5B, and FIG. 7, a conductive film K, which covers the interlayer insulating film 21 and the terminals TM, is formed in the active region DA and the non-active region NA (step S4a)

The conductive film K is formed by layering a conductive base material 22x that is arranged in a lower layer portion, a conductive light reflective material 22y that is arranged in an intermediate layer portion, and a conductive material 22z with a light transmissive characteristic that is arranged in an upper layer portion. The base material 22x is thicker than the light transmissive material 22z. Here, ITO is used as the base material 22x and the light transmissive material 22z, and an Ag alloy is used as the light reflective material 22y. The conductive film K is obtained by continuously forming an ITO film, an Ag alloy film, and an ITO film. Further, the thickness of the ITO constituting the base material 22x is set to be 50 nm or greater.

Figure 5C:
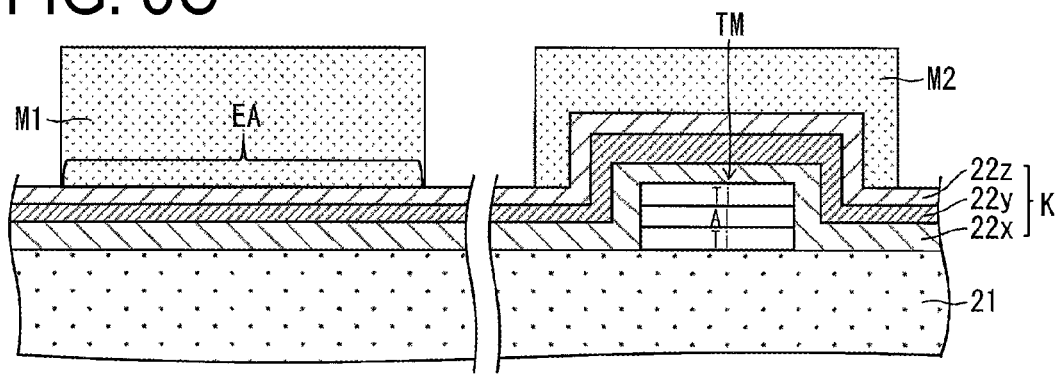

Next, as illustrated in FIG. 4, FIG. 5C, and FIG. 7, on the conductive film K, a first resist M1 (a first mask) that overlaps with an electrode region of the light emitting element (a region in which the anode electrode is formed) EA and a second resist M2 (a second mask) that overlaps with the terminals TM are formed (step S4b). The first resist M1 and the second resist M2 are respectively formed in the active region DA and the non-active region NA, while each being formed in an island-shape. In a plan view, the second resist M2 overlaps with the entire upper face and the end face of the terminals TM, and the terminals TM are positioned on the inside of the edges of the second resist M2. Note that the second resist M2 is formed to be thinner than the first resist M1 (a halftone resist structure or a gray tone resist structure).

Figure 5D:
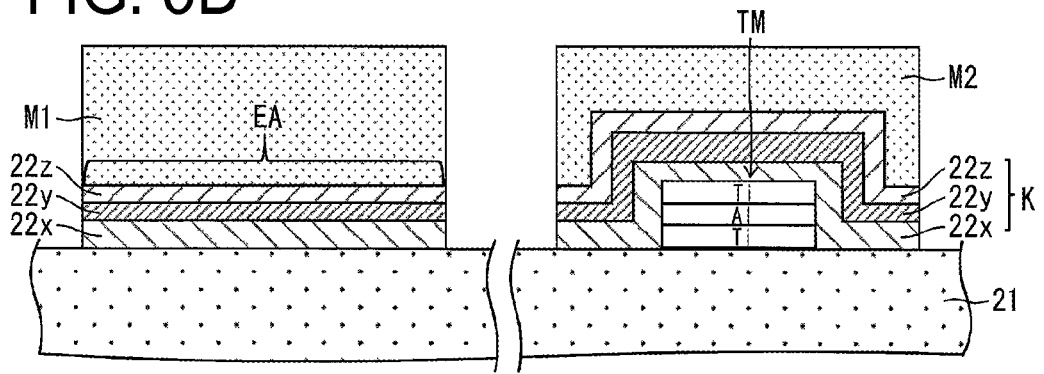

Next, as illustrated in FIG. 4 and FIG. 5D, the conductive film K is etched using the first resist M1 and the second resist M2 as masks (a first etching process, step S4c). Although the Al film included in the terminals TM is a low-tolerability metal layer that is etched by an etchant at step S4c, but since the end face of the Al film is covered with the conductive film K, the end face of the Al film is not etched at step S4c.

Figure 6A:
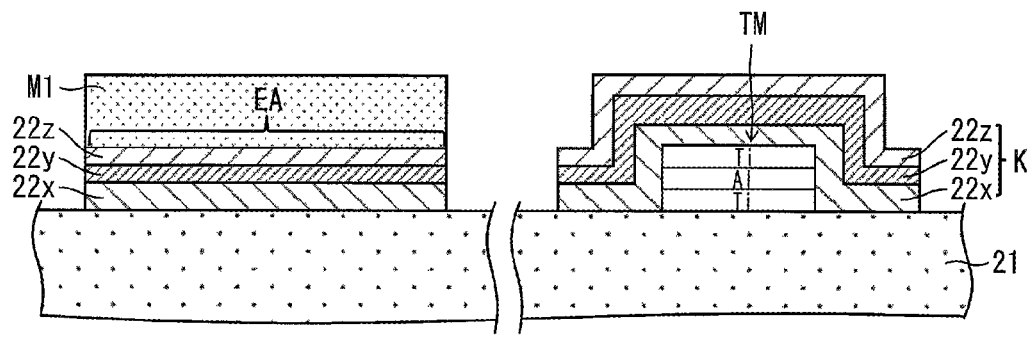
FIGS. 6A to 6C are cross-sectional views illustrating the formation process of the electrodes and the terminal film in the first embodiment.
Figure 7:
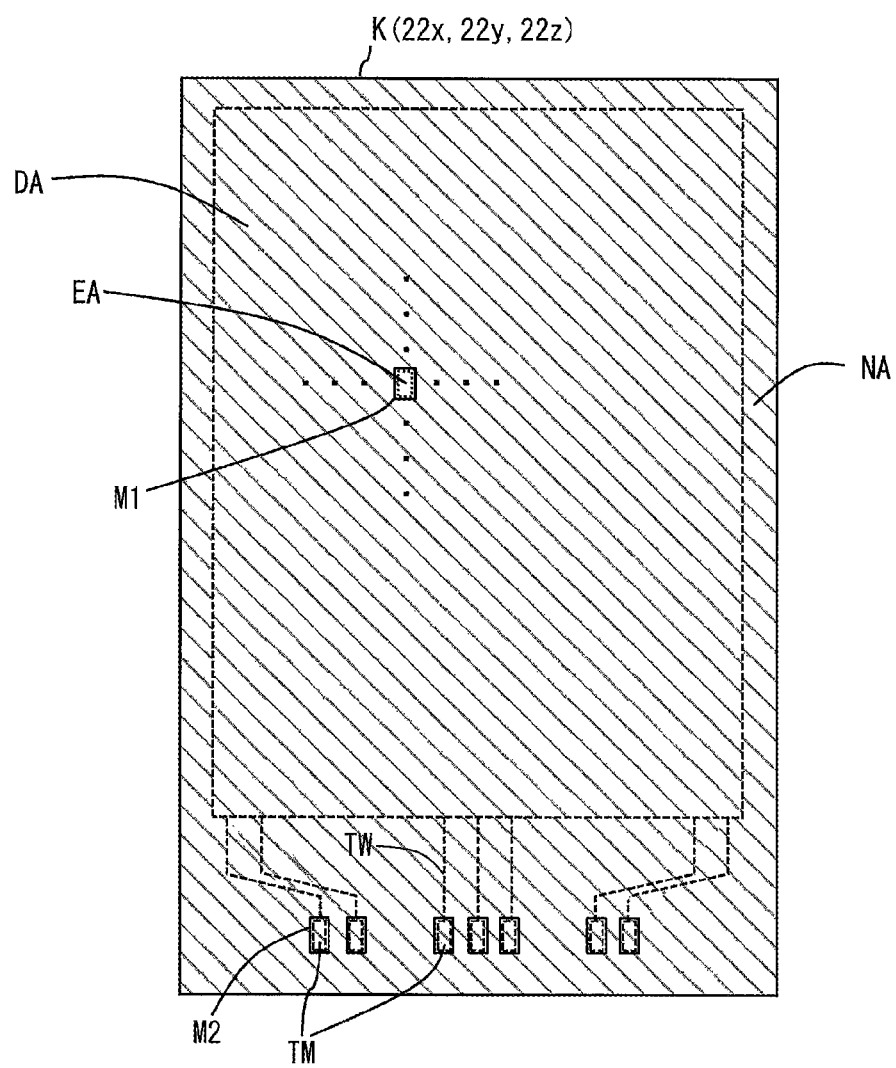
FIG. 7 is a plan view illustrating an arrangement example of masks.

Next, as illustrated in FIG. 4 and FIG. 6A, a part (an upper part) of the first resist M1 and the entire second resist M2 are removed (a removal process, step S4d).

Figure 6B:
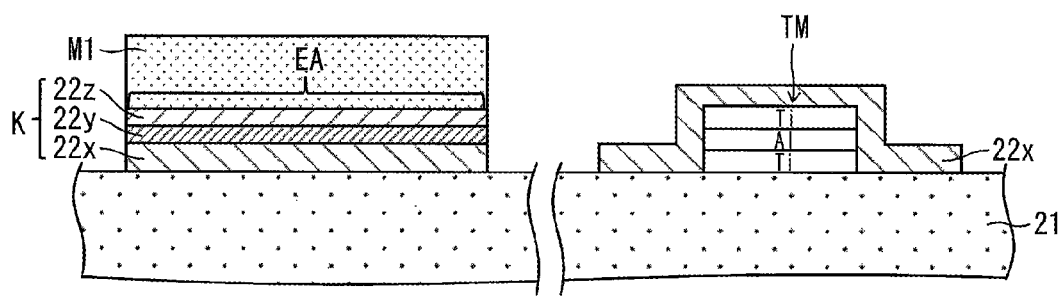

Next, as illustrated in FIG. 4 and FIG. 6B, the etching is performed on the light transmissive material 22z and the light reflective material 22y that are located on the upper side of the terminals TM (a second etching process, step S4e). At step S4e, the conductive film K of the electrode region EA is not etched, because the first resist M1 acts as the mask.

Figure 6C:
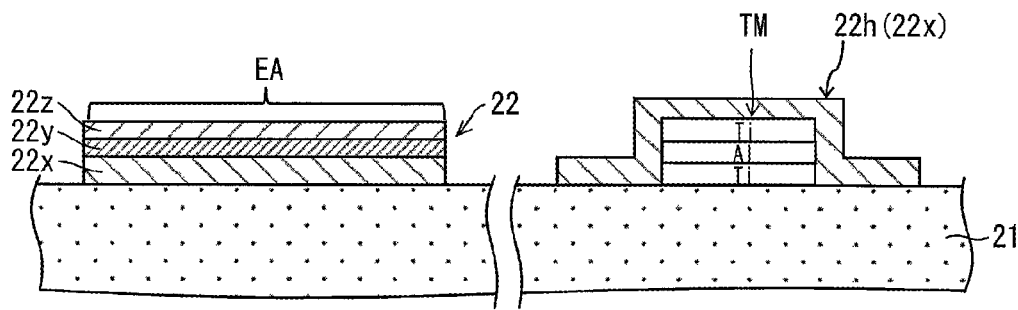

Next, as illustrated in FIG. 4 and FIG. 6C, the first resist M1 remaining in the electrode region EA is removed, while leaving the base material 22x, the light reflective material 22y, the light transmissive material 22z in the electrode region EA, and the base material 22x covering the upper face and the end face of the terminals TM.

As a result, as illustrated in FIG. 6C, the positive electrode 22 that is configured by the base material 22x (e.g., ITO), the light reflective material 22y (e.g., Ag alloy), the light transmissive material 22z (e.g., ITO), and a film 22h that is formed by the base material 22x (e.g., ITO) and covers the terminals TM can be formed.

Note that, at step S4 in FIG. 1, the EL layer 24 and the negative electrode 25 are formed on the top side of the positive electrode 22 in FIG. 6C. Further, at step S13 in FIG. 1, an electronic circuit board (e.g., IC chip or FPC) is mounted on the terminals TM, which are covered with the film, by using a thermocompression bonding tool, and the like.

Figure 8:
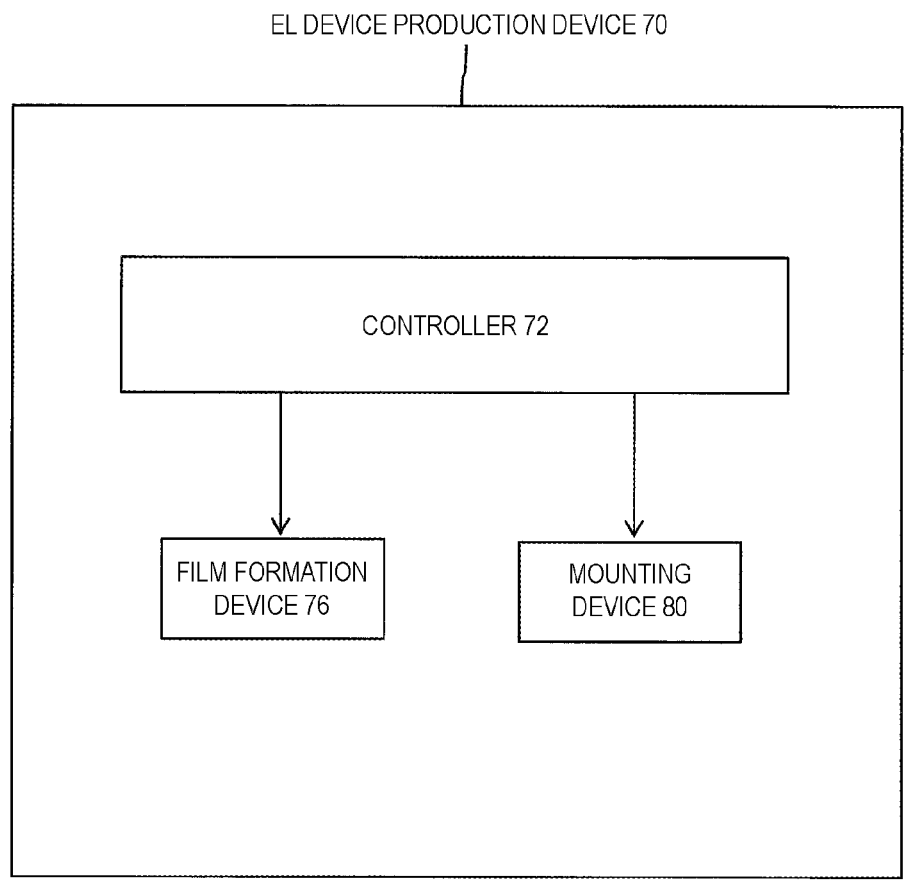
FIG. 8 is a block diagram illustrating a configuration of a display device production device of the first embodiment.

Note that, as illustrated in FIG. 8, a display device production device 70 includes a film formation device 76, a mounting device 80 that includes the thermocompression bonding tool, and the like, and a controller 72 that controls these devices, and the film formation device 76 that is controlled by the controller 72 performs step S4a to step S4f in FIG. 4.

In this way, in the display device 2, the light emitting element (e.g., OLED) is included in the active region DA, the terminals TM are included in the non-active region NA, the conductive base material 22x and the conductive light reflective material 22y are included in the positive electrode 22 of the light emitting element, and at least the end faces of the terminals TM are covered with the film 22h, which is configured by the base material 22x. Note that the base material 22x and the light transmissive material 22z may each include ITO or IZO.

The positive electrode 22 includes the base material 22x in the lower layer portion, the light reflective material 22y in the intermediate layer portion, and the conductive and light transmissive material 22z in the upper layer portion thereof. The thickness of the base material 22x of the lower layer portion is thicker than the thickness of the light transmissive material 22z of the upper layer portion.

The terminal TM is configured by sandwiching the low-tolerability metal layer (Al), which is to be etched by the above-described etchant, between two high-tolerability metal layers (e.g., Ti), which is not to be etched by an etchant of the positive electrode 22. Regarding the film 22h for covering the terminals TM, the base material 22x on the upper face of the terminal TM may be thinner than the base material 22x included in the positive electrode 22.

Figure 9A:
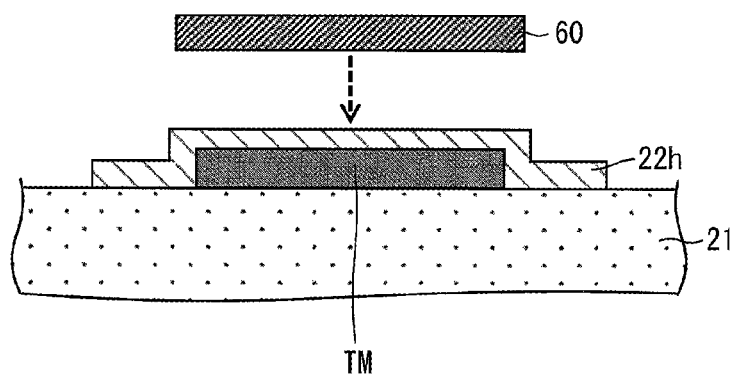
FIGS. 9A and 9B are cross-sectional views illustrating an example of an advantage of the first embodiment.
Figure 9B:
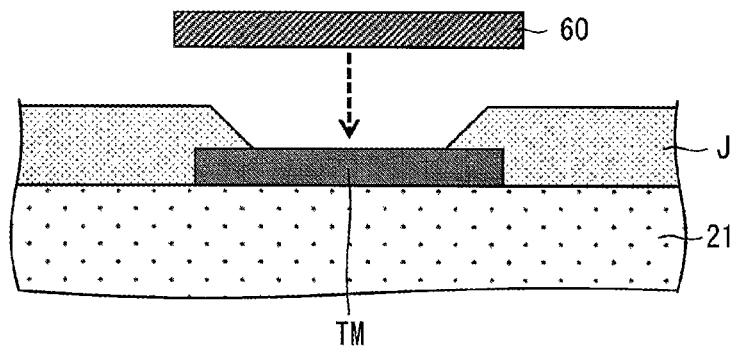

FIGS. 9A and 9B are cross-sectional views illustrating an example of an advantage in the first embodiment. As illustrated in FIG. 9A, in the display device 2 in the first embodiment, since the film (e.g., ITO) for covering the upper face and the end face of the terminal TM is formed in the same process as the lower layer portion of the positive electrode of the light emitting element, the electronic circuit board 60 (e.g., IC chip or FPC) can be easily mounted on the film with high reliability, and the number of processes can also be reduced. Note that, in a configuration of a comparative embodiment illustrated in FIG. 9B in which edges of the terminal TM are covered with an organic film, and the like, a large thickness of an organic film J may make it difficult to mount the electronic circuit board 60 with high reliability.

Second Embodiment

Figure 10A:
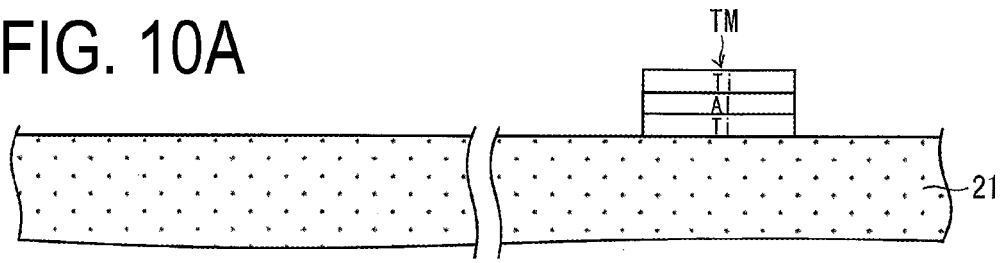
FIGS. 10A to 10D are cross-sectional views illustrating the formation process of the electrode and the terminal film in a second embodiment.
Figure 10B:
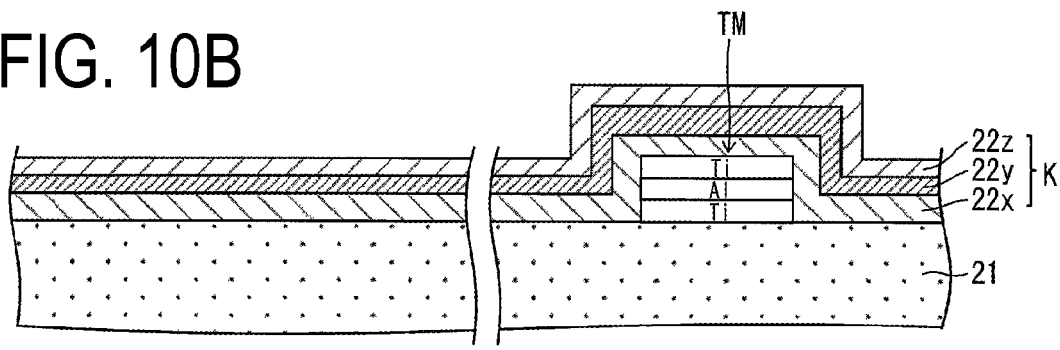
Figure 10C:
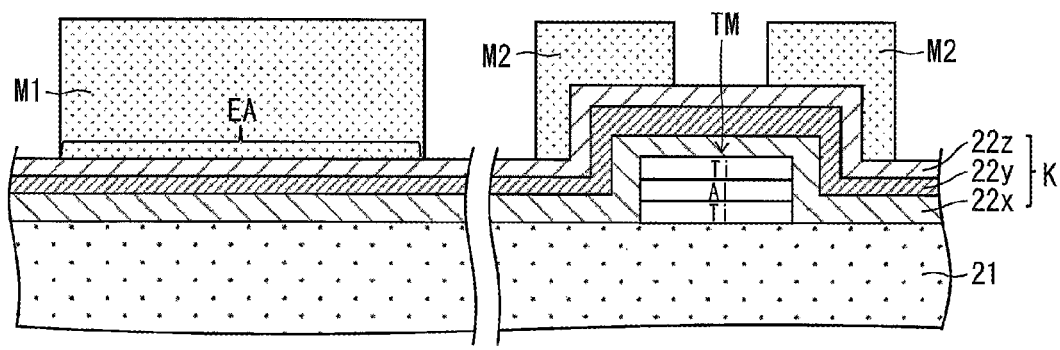
Figure 10D:
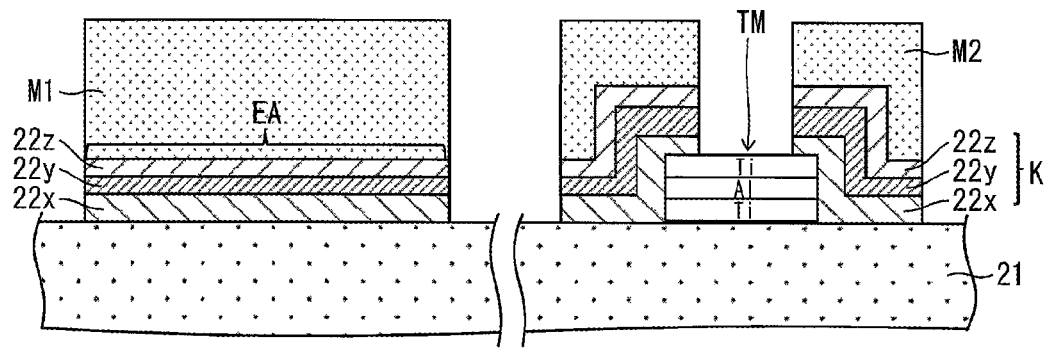

In FIG. 5C, the second resist M2 overlaps with the entire upper face and the end faces of the terminals TM in a plan view, but the present disclosure is not limited to this example. As illustrated in FIG. 10C, in a plan view, the second resist M2 can be configured to overlap with a peripheral part of the upper face of the terminal TM, but not to overlap with a central part of the upper face of the terminal TM. Note that, apart from the resist pattern, the configuration is the same as in the first embodiment illustrated in FIGS. 5A to 5D and FIGS. 6A to 6C.

Figure 11A:
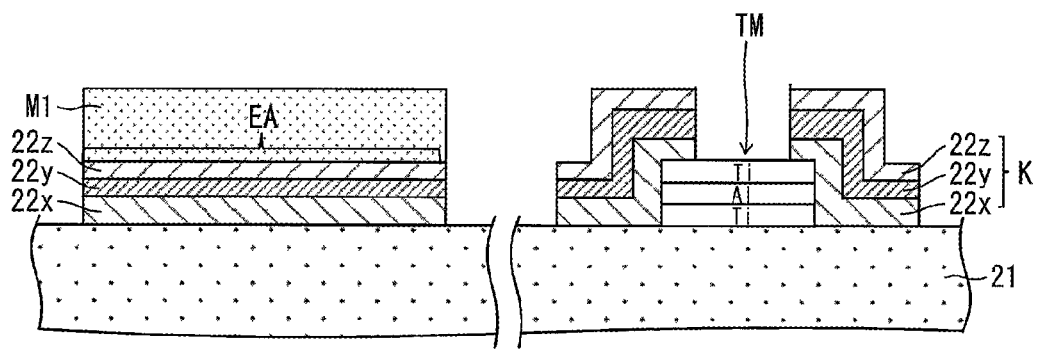
FIGS. 11A to 11C are cross-sectional views illustrating the formation process of the electrode and the terminal film in the second embodiment.
Figure 11B:
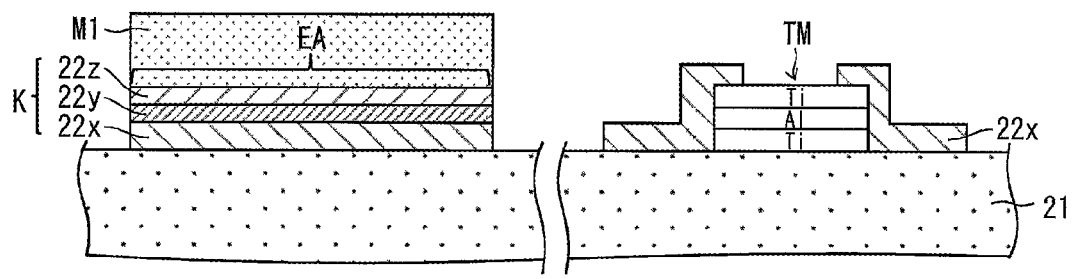
Figure 11C:
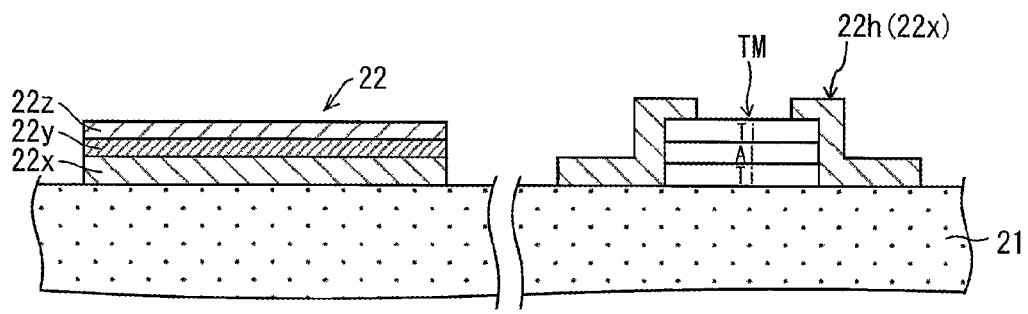

According to a second embodiment, as illustrated in FIG. 11C, a configuration can be adopted in which only the end face and the peripheral part of the upper face of the terminal TM are covered with the film 22h, which is configured by the base material 22x (e.g., ITO) of the anode electrode 22, and the central part of the upper face of the terminal TM is not covered with the film 22h (the Ti film that is the surface layer of the terminal TM is exposed). According to this configuration, in mounting the electronic circuit board, there is an advantage in that a contact resistance between the terminal TM and the electronic circuit board is reduced. Note that since the film for covering the peripheral part of the upper face of the terminal TM in FIG. 11C is much thinner than the organic film J illustrated in FIG. 9B, the mounting the electronic circuit board can be performed with high reliability.

Third Embodiment

In the first embodiment, the base material 22x may include ITO, and the light transmissive material 22z may include IZO. Since the etching can be more easily performed on IZO than on ITO (IZO has a higher etching rate), when the etching is performed on the light transmissive material 22z and the light reflective material 22y (see FIGS. 6A to 6C and FIGS. 11A to 11C), there is an advantage in that etch selectivity with the base material 22x (ITO) is improved and thus film thickness uniformity of the base material 22x that covers the terminal TM is improved.

Fourth Embodiment

Figure 12A:
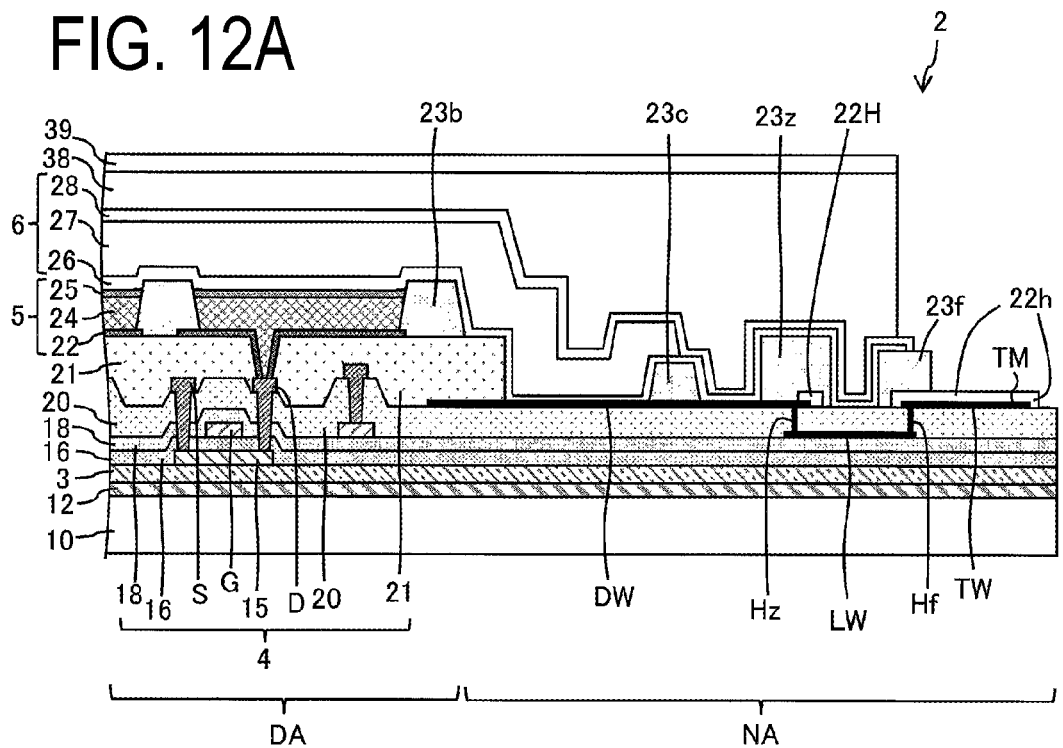
FIGS. 12A and 12B are cross-sectional views illustrating a configuration example of the display device of a fourth embodiment.
Figure 12B:
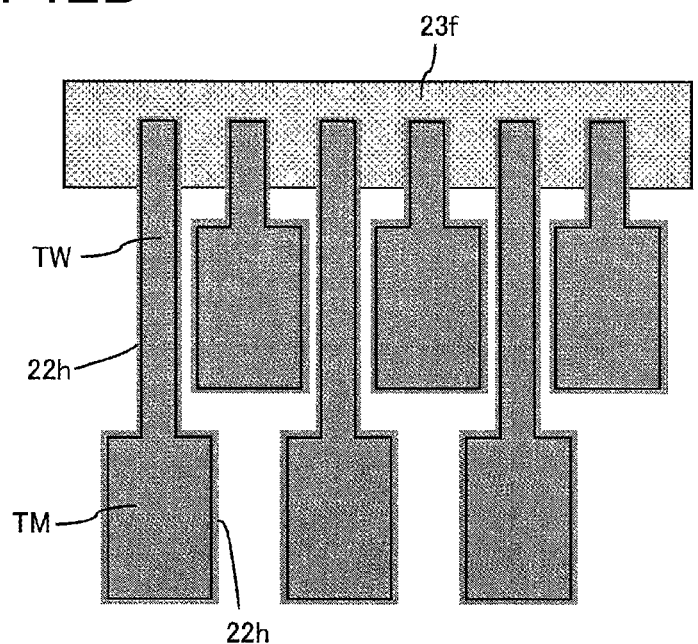

FIG. 12A is a cross-sectional view illustrating a configuration example of the display device in a fourth embodiment, and FIG. 12B is a plan view illustrating a configuration example of the display device in the fourth embodiment. As illustrated in FIGS. 12A and 12B, the display device 2 includes the terminals TM and terminal wiring lines TW, one end of which is connected to each of the terminal lines TM. Since the terminals TM and the terminal wiring lines TW are formed in the same process as the source wiring line S, and the like, the terminals TM and the terminal wiring line TW are formed in the same layer (on the inorganic insulating film 20) using the same material as the source wiring line, and the like.

The upper faces and the end faces of the terminals TM and the upper face and the end face of the terminal wiring line TW are covered with the film 22h that is configured by the base material 22x (e.g., ITO) of the positive electrode 22.

A cover body 23f, which is configured by an organic material, is provided in the non-active region NA, and the cover body 23f covers the other end of the terminal wiring line TW via the film 22h.

The terminal wiring line TW is connected to a relay wiring line LW via a contact hole Hf, which overlaps with the cover body 23f. The contact hole Hf penetrates through the inorganic insulating film 20, and the relay wiring line LW is formed in the same layer (namely, on the inorganic insulating film 18) as the capacity wiring line C.

The relay wiring line LW is connected to a lead-out wiring line DW, which extends from the active region DA of the TFT layer 4 via a contact hole Hz, which is formed to be closer to the active region DA than from the contact hole Hf. The contact hole Hz penetrates through the inorganic insulating film 20, and the lead-out wiring line DW is formed in the same layer (namely, on the inorganic insulating film 20) as the terminal wiring line TW, the source wiring line S, and the drain wiring line D. One end of the lead-out wiring line DW is covered with a film 22H, which is configured by the base material 22x (e.g., ITO) of the positive electrode 22. Since the film 22H is formed in the same process as the film 22h that covers the terminals TM and the terminal wiring line TW, the film 22H is formed in the same layer using the same material as the film 22h.

A protrusion 23z, which is configured by an organic material, is provided in the non-active region NA, and the protrusion 23z covers the one end of the lead-out wiring line DW, with the film 22H interposed therebetween. The contact hole Hz is formed to overlap with the protrusion 23z.

The protrusion 23c, the protrusion 23z, and the cover body 23f are formed in the same process as the bank 23b for covering the edges of the positive electrode 22, and thus the protrusion 23c, the protrusion 23z, and the cover body 23f are formed in the same layer and using the same material (for example, the photosensitive organic material to which a coating can be applied) as the bank 23b.

When the terminals TM and the terminal wiring line TW are formed in a multi-layer structure (for example, a structure in which Al is sandwiched by two layers of Ti), the moisture more easily travels in an extending direction of the wiring line. However, according to the configuration illustrated in FIGS. 12A and 12B, the infiltration of the moisture can be prevented by switching to the relay wiring line LW of the lower layer. Further, by covering the other end (the opposite side to the one end connected to the terminals TM) of the terminal wiring line TW with the cover body 23f and by covering the one end (on the non-active region side) of the lead-out wiring line DW with the protrusion 23z, the infiltration of the moisture can be further prevented.

An electro-optical element provided in the display device in to the fourth embodiment is not particularly limited. Examples of the display device include an organic electroluminescence (EL) display provided with the Organic Light Emitting Diode (OLED) as the electro-optical element, an inorganic EL display provided with an inorganic light emitting diode as the electro-optical element, and a Quantum dot Light Emitting Diode (QLED) display with a QLED serving as the electro-optical element.

Supplement

Aspect 1: A display device production method is used for producing a display device that includes a light emitting element in an active region and a terminal in a non-active region. The display device production method includes: arranging a first mask overlapping with an electrode region of the light emitting element and a second mask overlapping with the terminal, on a conductive film that is arranged in the active region and the non-active region and that covers the terminal, and etching the conductive film, in a first etching process.

Aspect 2: In the display device production method according to aspect 1, for example, the second mask overlaps with at least an end face of the terminal, in a plan view.

Aspect 3: In the display device production method according to aspect 2, for example, the terminal is located inside edges of the second mask, in a plan view.

Aspect 4: In the display device production method according to aspect 2, for example, the first mask is a first resist, and the second mask is a second resist that is thinner than the first resist.

Aspect 5: In the display device production method according to aspect 2, for example, the terminal includes a low-tolerability metal layer to be etched by an etchant in the first etching process.

Aspect 6: The display device production method according to aspect 4, for example, further includes removing a part of the first resist and all of the second resist after the first etching process.

Aspect 7: In the display device production method according to aspect 6, for example, the conductive film includes a conductive base material that is arranged in a lower layer portion, a conductive light reflective material that is arranged in an intermediate layer portion, and a conductive and light transmissive material that is arranged in an upper layer portion.

Aspect 8: The display device production method according to aspect 7, for example, further includes a second etching step on a light transmissive material and the light reflective material that are located above the terminal, after the step of removing.

Aspect 9: In the display device production method according to aspect 8, for example, a film for covering at least an edge of the terminal and is configured by the base material is formed in the second etching process.

Aspect 10: In the display device production method according to aspect 8, for example, in the second etching process, the conductive film in the electrode region is not etched due to the first resist.

Aspect 11: In the display device production method according to aspect 10, for example, after the second etching process, the first resist remaining in the electrode region is removed, and an electrode of the light emitting element is formed by the base material, the light reflective material, and the light transmissive material remaining in the electrode region.

Aspect 12: In the display device production method according to aspect 5, for example, the terminal is configured by sandwiching the low-tolerability metal layer between two high-tolerability metal layers that are not etched by the etchant in the first etching process.

Aspect 13: In the display device production method according to aspect 7, for example, the base material and the light transmissive material both include ITO.

Aspect 14: In the display device production method according to aspect 7, for example, the base material includes ITO and the light transmissive material includes IZO.

Aspect 15: In the display device production method according to aspect 7, for example, a thickness of the base material is greater than a thickness of the light transmissive material.

Aspect 16: In the display device production method according to aspect 15, for example, the thickness of the base material is 50 nm or greater.

Aspect 17: In the display device production method according to aspect 9, for example, the film is bonded with an electronic circuit board by thermocompression.

Aspect 18: A display device includes a light emitting element in an active region, and a terminal in a non-active region. A conductive base material and a conductive light reflective material are included in an electrode of the light emitting element, and at least an end face of the terminal is covered with a film that is configured by the base material.

Aspect 19: In the display device according to aspect 18, for example, the electrode includes the base material arranged in a lower layer portion, the light reflective material that is arranged in an intermediate layer portion, and a conductive and light transmissive material that is arranged in an upper layer portion.

Aspect 20: In the display device according to aspect 19, for example, a thickness of the base material is greater than a thickness of the light transmissive material, in the electrode.

Aspect 21: In the display device according to aspect 19 or 20, for example, the film covers at least a part of an upper face of the terminal and an end face of the terminal.

Aspect 22: In the display device according to aspect 21, for example, the base material on the terminal is thinner than the base material included in the electrode.

Aspect 23: In the display device according to any one of aspects 18 to 22, for example, the terminal is configured by sandwiching a low-tolerability metal layer of the electrode to be etched by an etchant for the electrode between two high-tolerability metal layers that are not etched by the etchant.

Aspect 24: In the display device according to any one of aspects 19 to 22, for example, the base material and the light transmissive material are both ITO.

Aspect 25: In the display device according to any one of aspects 19 to 22, for example, the base material is ITO and the light transmissive material is IZO.

Aspect 26: In the display device according to any one of aspects 18 to 25, for example, a terminal wiring line is included in the non-active region, one end of the terminal wiring line being connected to the terminal, and at least an end face of the terminal wiring line is covered with the film.

Aspect 27: In the display device according to aspect 26, for example, a cover body is provided for covering another end of the terminal wiring line via the film, and the cover body is configured by a material identical to a material of a bank for covering an edge of the electrode of the light emitting element.

Aspect 28: In the display device according to aspect 27, for example, the terminal wiring line is connected to a relay wiring line via a contact hole that is formed in an inorganic insulating film below the terminal wiring line and that overlaps with the cover body.

Aspect 29: In the display device according to aspect 28, for example, the relay wiring line is connected to a lead-out wiring line via another contact hole that is located closer to an active region than from the contact hole and that is formed in the inorganic insulating film.

Aspect 30: In the display device according to aspect 29, for example, the terminal wiring line and the lead-out wiring line are formed in an identical layer.

Aspect 31: In the display device according to aspect 29 or 30, for example, one end of the lead-out wiring line is covered with a film that is configured by the base material.

Aspect 32: In the display device according to aspect 31, for example, a protrusion configured by an organic material and covering the one end of the lead-out wiring line is provided via the film.

Aspect 33: In the display device according to aspect 32, for example, the cover body and the protrusion are configured by a material identical to a material of the bank for covering the edge of the electrode of the light emitting element.

Aspect 34: A display device production device for a display device including a light emitting element in an active region and a terminal in a non-active region. The display device production device is configured to: arrange a first mask overlapping with an electrode region of the light emitting element and a second mask overlapping with the terminal, on a conductive film that is arranged in the active region and the non-active region and that covers the terminal; and etch the conductive film.

Aspect 35: A film formation device is used for producing a display device including a light emitting element in an active region and a terminal in a non-active region. The display device production device is configured to: arrange a first mask overlapping with an electrode region of the light emitting element and a second mask overlapping with the terminal, on a conductive film that is arranged in the active region and the non-active region and that covers the terminal; and etch the conductive film.

The disclosure is not limited to the embodiments stated above. Embodiments obtained by appropriately combining technical approaches stated in each of the different embodiments also fall within the scope of the technology of the disclosure. Further, novel technical features may be formed by combining the technical approaches stated in each of the embodiments.

REFERENCE SIGNS LIST

2 Display device
4 TFT layer
5 Light emitting element layer
6 Sealing layer
10 Lower face film
12 Resin layer
16 Inorganic insulating film
18 Inorganic insulating film
20 Inorganic insulating film
21 Interlayer insulating layer
22x Base material
22y Light reflective material
22z Light transmissive material
24 EL layer
26 First inorganic sealing film
27 Organic sealing film
28 Second inorganic sealing film
50 Substrate
60 Electronic circuit board
70 Display device production device
76 Film formation device
TM Terminal
TW Terminal wiring line
K Conductive film
M1 First resist
M2 Second resist
EA Electrode region
NA Non-active region
DA Active region
DW Lead-out wiring line
23b Bank
23c, 23z Protrusion
23f Cover body

The invention claimed is:

1. A display device comprising:
a light emitting element in an active region and including an electrode that includes a base material that is conductive, a light reflective material that is conductive, and a light transmissive material that is conductive, the base material being in a lower layer portion of the electrode, the light reflective material being in an intermediate layer portion of the electrode, and the light transmissive material being in an upper layer portion of the electrode; and
a terminal in a non-active region, wherein
at least an end surface of the terminal is covered with a film that is a single layer made of a material identical to the base material,
a terminal wiring line is included in the non-active region, one end of the terminal wiring line being connected to the terminal,
at least an end surface of the terminal wiring line is covered with the film,
a cover body is provided to cover another end of the terminal wiring line via the film, and
the cover body is made of a material identical to a material of a bank that covers an edge of the electrode of the light emitting element.

2. The display device according to claim 1, wherein a thickness of the base material is greater than a thickness of the light transmissive material, in the electrode.

3. The display device according to claim 1, wherein the film covers at least a portion of an upper surface of the terminal and the end surface of the terminal.

4. The display device according to claim 3, wherein the base material on the terminal is thinner than the base material included in the electrode.

5. The display device according to claim 1, wherein the terminal includes a multi-layer structure in which a layer of aluminum is sandwiched by two layers of titanium.

6. The display device according to claim 1, wherein the base material and the light transmissive material both include indium tin oxide (ITO).

7. The display device according to claim 1, wherein the base material includes indium tin oxide (ITO) and the light transmissive material includes indium zinc oxide (IZO).

8. The display device according to claim 1, wherein
the terminal wiring line is connected to a relay wiring line via a contact hole that is defined in an inorganic insulating film below the terminal wiring line and that overlaps with the cover body, and
the relay wiring line is connected to a lead-out wiring line that extends from the active region.

9. The display device according to claim 8, wherein the relay wiring line is connected to the lead-out wiring line via another contact hole that is located closer to the active region than from the contact hole and that is in the inorganic insulating film.

10. The display device according to claim 9, wherein the terminal wiring line and the lead-out wiring line are in an identical layer.

11. The display device according to claim 9, wherein one end of the lead-out wiring line is covered with another film that is a single layer made of a material identical to the base material.

12. The display device according to claim 11, wherein a protrusion made of an organic material and covering the one end of the lead-out wiring line is provided via the film.

13. The display device according to claim 12, wherein the cover body and the protrusion are made of a material identical to a material of the bank for covering the edge of the electrode of the light emitting element.

14. The display device according to claim 1, wherein the film directly contacts the at least an end surface of the terminal and the at least an end surface of the terminal wiring line.

15. A display device comprising:
a light emitting element in an active region and including an electrode that includes a base material that is conductive, a light reflective material that is conductive, and a light transmissive material that is conductive, the base material being in a lower layer portion of the electrode, the light reflective material being in an intermediate layer portion of the electrode, and the light transmissive material being in an upper layer portion of the electrode;
a terminal in a non-active region; and
a terminal wiring line in the non-active region, one end of the terminal wiring line being connected to the terminal, wherein
at least an end surface of the terminal is covered with a film that is a single layer made of a material identical to the base material,
at least an end surface of the terminal wiring line is covered with the film,
a thickness of the base material is greater than a thickness of the light transmissive material, in the electrode,
a cover body is provided to cover another end of the terminal wiring line via the film, and
the cover body is made of a material identical to a material of a bank that covers an edge of the electrode of the light emitting element.

16. The display device according to claim 15, wherein the film covers at least a portion of an upper surface of the terminal and the end surface of the terminal.

17. The display device according to claim 16, wherein the base material on the terminal is thinner than the base material included in the electrode.

18. A display device comprising:
a light emitting element in an active region and including an electrode that includes a base material that is conductive, a light reflective material that is conductive, and a light transmissive material that is conductive, the base material being in a lower layer portion of the electrode, the light reflective material being in an intermediate layer portion of the electrode, and the light transmissive material being in an upper layer portion of the electrode;
a terminal in a non-active region; and
a terminal wiring line in the non-active region, one end of the terminal wiring line being connected to the terminal, wherein
at least an end surface of the terminal is covered with a film that is a single layer made of a material identical to the base material,
at least an end surface of the terminal wiring line is covered with the film,
the terminal has a multi-layer structure in which a layer of aluminum is sandwiched by two layers of titanium,
a cover body is provided to cover another end of the terminal wiring line via the film, and
the cover body is made of a material identical to a material of a bank that covers an edge of the electrode of the light emitting element.

* * * * *